United States Patent
Hu et al.

(10) Patent No.: US 10,061,210 B2
(45) Date of Patent: Aug. 28, 2018

(54) 3D TARGET FOR MONITORING MULTIPLE PATTERNING PROCESS

(71) Applicant: Nanometrics Incorporated, Milpitas, CA (US)

(72) Inventors: Jiangtao Hu, Sunnyvale, CA (US); Nicholas James Keller, New York, NY (US)

(73) Assignee: Nanometrics Incorporated, Milpitas, CA (US)

( * ) Notice: Subject to any disclaimer, the term of this patent is extended or adjusted under 35 U.S.C. 154(b) by 25 days.

(21) Appl. No.: 15/217,867

(22) Filed: Jul. 22, 2016

(65) Prior Publication Data

US 2017/0031248 A1    Feb. 2, 2017

Related U.S. Application Data

(60) Provisional application No. 62/199,612, filed on Jul. 31, 2015.

(51) Int. Cl.
| | |
|---|---|
| *G03F 9/00* | (2006.01) |
| *G03F 7/20* | (2006.01) |
| *G01B 11/27* | (2006.01) |
| *H01L 21/66* | (2006.01) |

(52) U.S. Cl.
CPC ........ *G03F 7/70633* (2013.01); *G01B 11/272* (2013.01); *G03F 7/70616* (2013.01); *G03F 7/70625* (2013.01); *H01L 22/30* (2013.01)

(58) Field of Classification Search
CPC ............. G03F 7/70633; G03F 7/70616; G03F 7/70625; H01L 22/30; G01B 11/272
USPC ............................................ 430/22, 30, 394
See application file for complete search history.

(56) References Cited

U.S. PATENT DOCUMENTS

| | | | |
|---|---|---|---|
| 7,804,994 B2* | 9/2010 | Adel | ....................... G03F 7/705 356/399 |
| 2003/0223630 A1 | 12/2003 | Adel et al. | |
| 2006/0109438 A1 | 5/2006 | Smith et al. | |
| 2012/0074400 A1 | 3/2012 | Shieh et al. | |
| 2012/0299159 A1 | 11/2012 | Chen | |
| 2014/0065832 A1 | 3/2014 | Hsieh et al. | |

OTHER PUBLICATIONS

International Search Report and Written Opinion, PCT/US2016/043886, International Searching Authority, dated Dec. 5, 2016, pp. 1-13.

* cited by examiner

*Primary Examiner* — Christopher G Young
(74) *Attorney, Agent, or Firm* — Silicon Valley Patent Group LLP

(57) ABSTRACT

A metrology target is designed for monitoring variations in a multiple patterning process, such as a self-aligned doubled patterning (SADP) or self-aligned quadruple patterning (SAQP) process. The metrology target may include a plurality of sub-patterns. For example, the metrology target may be a three-dimensional (3D) target rather than a conventional two-dimensional line-space target design. The 3D target design includes multiple sub-patterns arranged with a pitch in a direction that is different than the pitch of the lines and trenches. The pitch of the sub-patterns is sufficient so that multiple sub-patterns are simultaneously within the field of measurement.

7 Claims, 10 Drawing Sheets

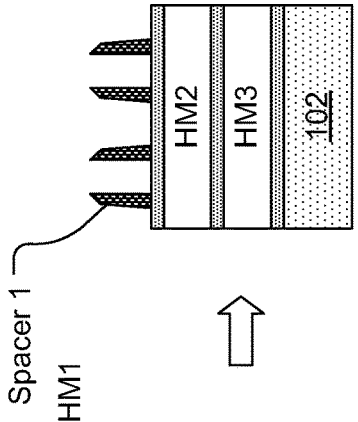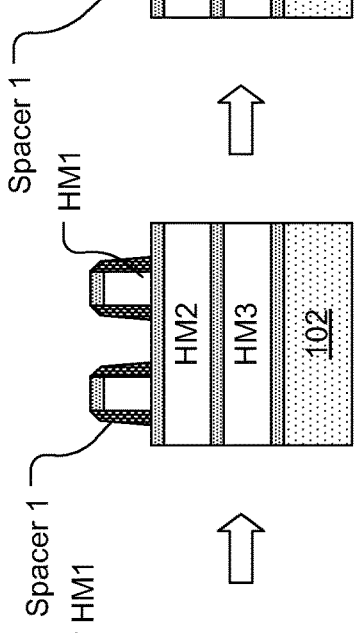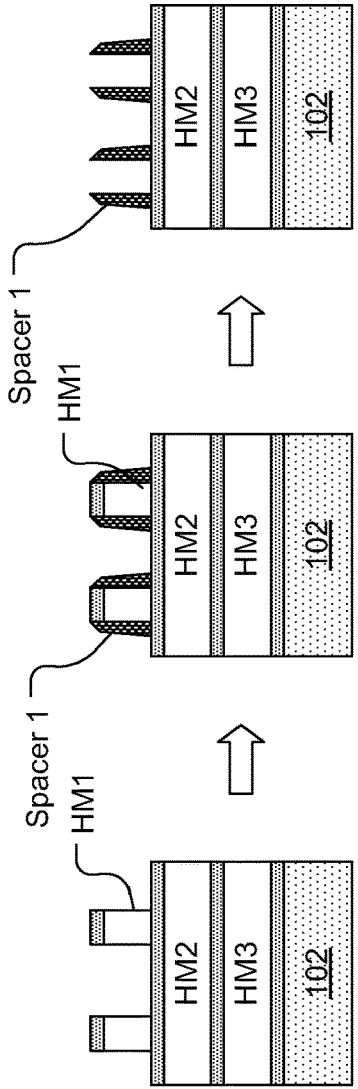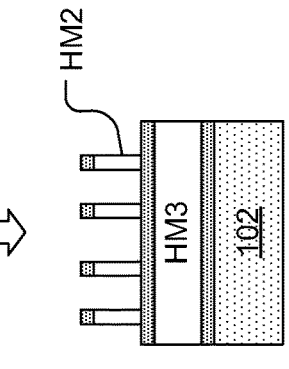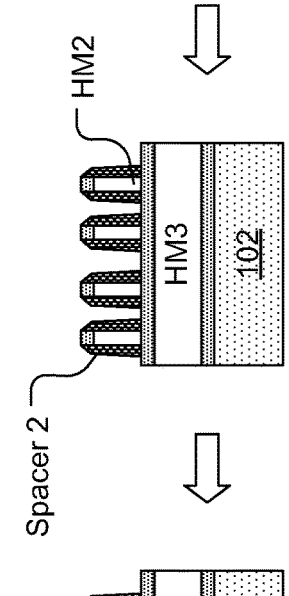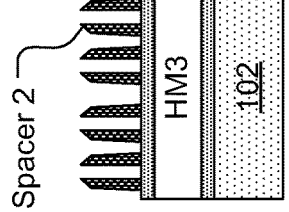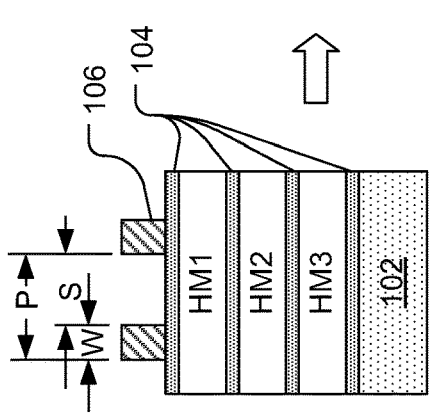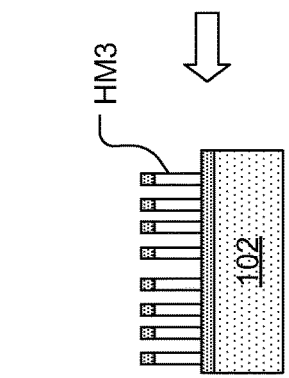

3D TARGET FOR MONITORING MULTIPLE PATTERNING PROCESS

CROSS-REFERENCE TO RELATED APPLICATIONS

This application claims under 35 USC § 119 the benefit of and priority to U.S. Provisional Application No. 62/199,612, filed Jul. 31, 2015, entitled "3D Target for Monitoring Multiple Patterning Process," which is assigned to the assignee hereof and is incorporated herein by reference.

BACKGROUND

Background Field

Embodiments of the subject matter described herein are related generally to optical metrology targets, and more particularly to target design and manufacture for monitoring a multiple patterning process.

Relevant Background

As critical dimensions (CD) in semiconductor devices continue to shrink, the use of multiple patterning has become an important method. Multiple patterning processes, such as self-aligned doubled patterning process and self-aligned quadruple patterning process, is a technology that is used to extend photolithography beyond diffraction limit thereby enhancing feature density. As the name implies, multiple patterning processes include more than one patterning process step. For example, self-aligned doubled patterning process includes two patterning process steps: a lithography patterning step and a self-aligned spacer step. Self-aligned quadruple patterning process typically includes three patterning process steps: lithography patterning, a first self-aligned spacer step and a second self-aligned spacer step. Each of the patterning process steps in a multiple patterning process will contribute to the final critical dimension uniformity and CD distribution within the printed structure. To control the process and to achieve optimum CD distribution, it is necessary to determine the contribution of each patterning step to the final CD variation.

SUMMARY

A metrology target is designed for monitoring variations in a multiple patterning process, such as a self-aligned doubled patterning (SADP) or self-aligned quadruple patterning (SAQP) process. The metrology target may include a plurality of sub-patterns. For example, the metrology target may be a three-dimensional (3D) target rather than a conventional two-dimensional line-space target design. The 3D target design includes multiple sub-patterns arranged with a pitch in a direction that is different than the pitch of the lines and trenches. The pitch of the sub-patterns is sufficient so that multiple sub-patterns are simultaneously within the field of measurement of the metrology device.

In one implementation, a metrology target on a wafer for monitoring a multiple patterning process comprises a plurality of orthogonally arranged lines and trenches produced with the multiple patterning process producing a plurality of sub-patterns having a first pitch in a first direction and, wherein the lines and trenches in each sub-pattern have a second pitch that is in a second direction that is different than the first direction, wherein the orthogonally arranged lines in each sub-pattern produces two sets of a first box, with a trench disposed within the first box and a second trench between the two sets, and wherein the first pitch and the second pitch of the plurality of sub-patterns are configured so that there are a plurality of sub-patterns within a field of measurement of a metrology device.

In one implementation, a method of manufacturing a metrology target on a wafer for monitoring a multiple patterning process, comprises performing a lithography patterning step to pattern a set of resist for the metrology target, wherein, the set of resist for the metrology target is patterned with a first pitch in a first direction and a second pitch in a second direction that is different than the first direction; and performing etching processes and at least a first self-aligned spacer process to produce the metrology target comprising a plurality of orthogonally arranged lines and trenches producing a plurality of sub-patterns having a third pitch in the first direction and, wherein the lines and trenches in each sub-pattern have a fourth pitch in the second direction, wherein the orthogonally arranged lines in each sub-pattern produces two sets of a first box, with a trench disposed within the first box and a second trench between the two sets, and wherein the first pitch and the second pitch of the plurality of sub-patterns are configured so that there are a plurality of sub-patterns within a field of measurement of a metrology device.

In one implementation, a method of monitoring a multiple patterning process comprises producing a metrology target on a wafer with the multiple patterning process, the metrology target comprising a plurality of orthogonally arranged lines and trenches producing a plurality of sub-patterns having a first pitch in a first direction, wherein the lines and trenches in each sub-pattern have a second pitch that is in a second direction that is different than the first direction, wherein the orthogonally arranged lines in each sub-pattern produces two sets of a first box, with a trench disposed within the first box and a second trench between the two sets; producing illumination with an optical metrology device that is focused into a field of measurement on the metrology target, wherein the first pitch and the second pitch of the plurality of sub-patterns are configured so that there are a plurality of sub-patterns within the field of measurement of the optical metrology device; collecting scatterometry data with the optical metrology device from the illumination scattered from the metrology target within the field of measurement; and analyzing the scatterometry data from the metrology target to monitor the multiple patterning process, wherein the analysis of the scatterometry data produces the dimension and registration of the plurality of orthogonally arranged lines and trenches in the metrology target.

BRIEF DESCRIPTION OF THE DRAWINGS

FIGS. 1A-1H illustrate cross sectional views of a typical multiple patterning process.

DETAILED DESCRIPTION

Figure 2:
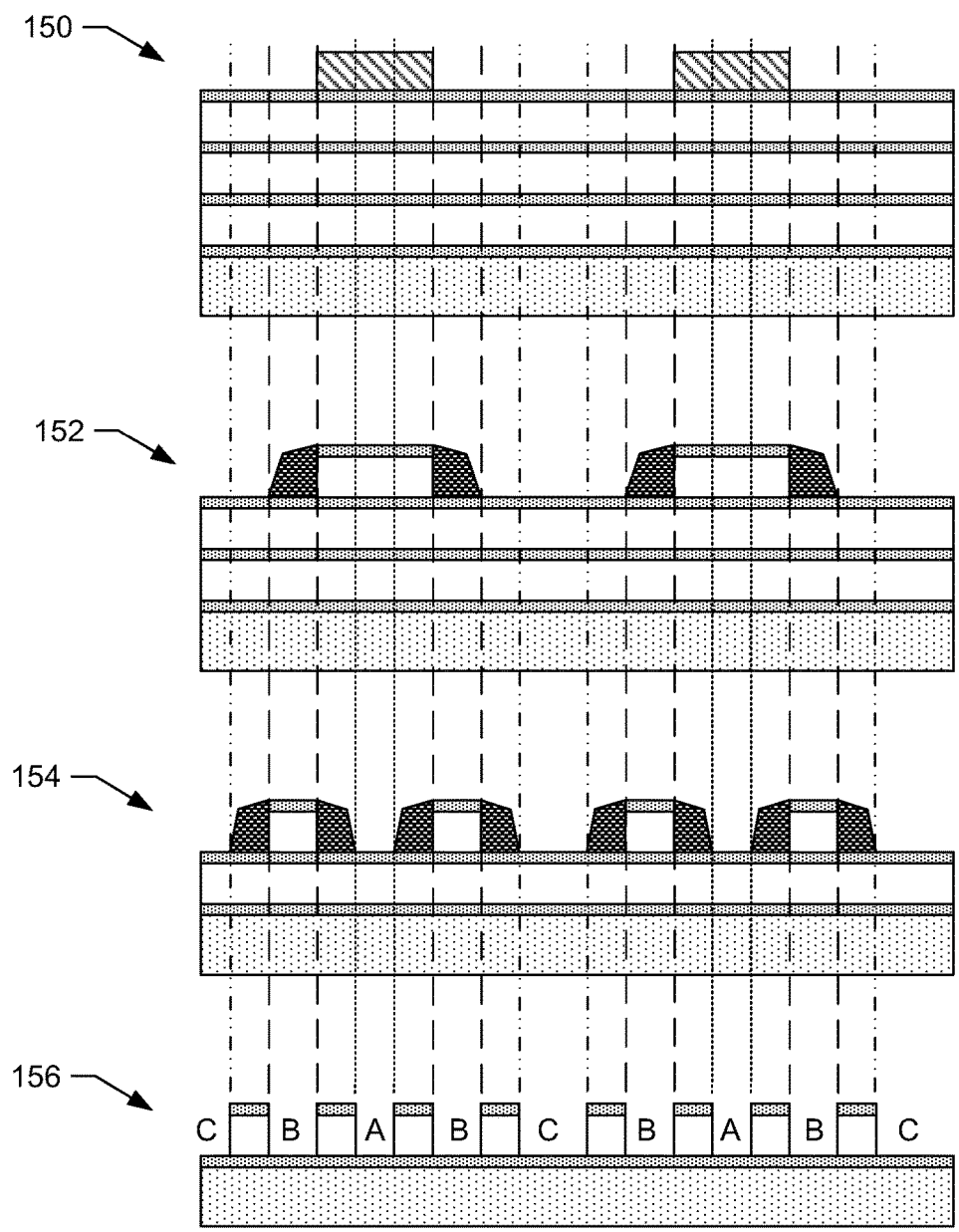
FIG. 2 illustrates cross-sectional views of three patterning process steps in self-aligned quadruple patterning (SAQP) process along with the resulting device.

In accordance with an embodiment of the present invention, scatterometry techniques and designed targets may be used to measure the CD variation in the final step of a multiple patterning process, such as self-aligned doubled patterning (SADP) process, self-aligned triple patterning (SATP), self-aligned quadruple patterning (SAQP) process, or self-aligned octuple patterning (SAOP). The targets discussed herein may be located within scribe lines between chips or may be located within the chips, e.g., in active areas of the chips. The metrology target may have a three-dimensional (3D) design, rather than the conventional two-dimensional (2D) line-space design. By way of example, the conventional line-space target design for measuring multiple patterning process, such as SAQP process, have high measurement uncertainty as it is difficult to correlate individual line and spaces to a particular patterning step. With the use of the 3D target, the deficiencies of a conventional 2D target are overcome.

FIGS. 1A-1H illustrate cross sectional views of a typical multiple patterning process, such as SADP or SAQP. As illustrated in FIG. 1A, a device 100 includes a film 102 (or substrate) with three hard mask layers (HM1, HM2, and HM3) and intervening dielectric layers 104 overlying the film 102. In an SADP process, the hard mask HM3 and overlying dielectric layer would not be present. FIG. 1A illustrates the lithography patterning step in which resist 106 is patterned in a line over the top dielectric layer 104. By way of example, the resist 106 line may have a width W of 45 nm, and there may be a space S of 75 nm between the resist 106, producing a pitch P of 120 nm. FIG. 1B illustrates the device after etching the hard mask HM1, leaving hard mask HM1 only under areas protected by resist 106. FIG. 1C illustrates the device after the first self-aligned spacer step, including the first spacer deposition and anisotropic etch, resulting in spacers 1. The spacers 1, by way of example, may have a width of 15 nm. FIG. 1D illustrates the device after etching the remaining hard mask HM1 leaving spacers 1. FIG. 1E illustrates the device after etching the hard mask HM2, leaving hard mark HM2 only under areas protected by spacers 1. In a SADP process, the process would be finished after the etching of the hard mask HM2 as shown in FIG. 1E (and the hard mask HM3 and overlying dielectric layer would not be present). In the SAQP, the process continues, as illustrated in FIG. 1F. FIG. 1F illustrates the device after the second self-aligned spacer step, including the second spacer deposition and anisotropic etch, resulting in spacers 2. The spacers 2, by way of example, may have a width of 15 nm. FIG. 1G illustrates the device after etching the remaining hard mask HM2 leaving spacers 2. FIG. 1H illustrates the resulting device after etching the hard mask HM3, leaving hard mark HM3 only under areas protected by spacers 2. The resulting device, for example, includes a number of lines having widths of 15 nm and trenches having widths 15 nm, resulting in a pitch of 30 nm.

FIG. 2, by way of example, illustrates the impact of the different patterning steps on the resulting trenches in a multiple patterning process. Specifically, FIG. 2 illustrates cross-sectional views of the three patterning process steps in the SAQP process along with the resulting device, with dotted, dashed, and dash-dotted lines illustrating the impact of the different patterning steps on the resulting trenches. Thus, FIG. 2 illustrates the lithography patterning step 150 (also shown in FIG. 1A), the first self-aligned spacer step 152 (shown in FIG. 1C), and the second self-aligned spacer step 154 (shown in FIG. 1F), along with the resulting device 156 (shown in FIG. 1H). FIG. 2 illustrates the alignment of trenches labeled A with dotted lines, the alignment of trenches labeled B with dashed lines, and the alignment of trenches labeled C with dashed dotted lines. As can be seen in FIG. 2, the width and location of trenches are dependent on the lithography patterning step 150, the first self-aligned spacer step 152, and the second self-aligned spacer step 154.

Figure 3A:
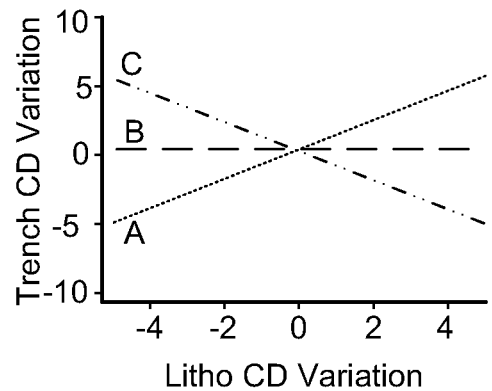
FIGS. 3A, 3B, and 3C are graphs illustrating the impact of each process step in FIG. 2 on CD variations.
Figure 3B:
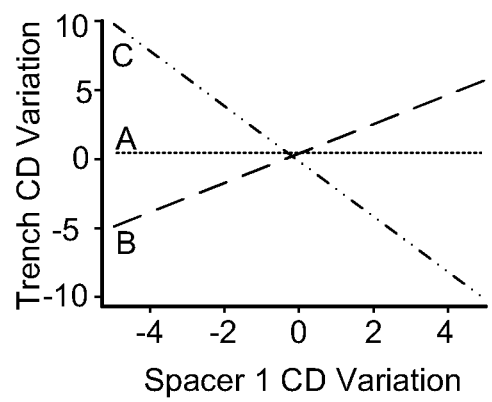
Figure 3C:
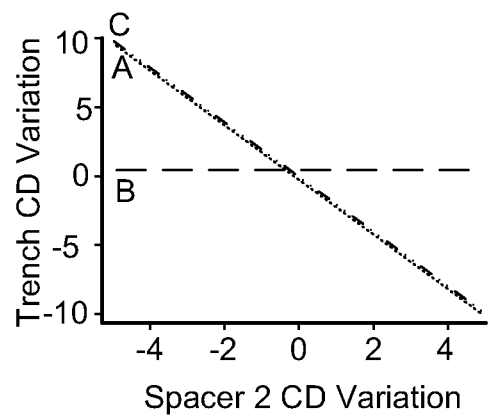

FIGS. 3A, 3B, and 3C are graphs illustrating the impact of each process step on CD variations in the SAQP process. For example, FIG. 3A is a graph illustrating the impact of variation in the lithography CD on the trench CD. As can be seen in FIG. 3A, when the CD in the lithography step is larger, i.e., the width W of the resist in FIG. 1A is larger, the width of trench B is constant, the width of trench A will increase and the width of trench C is smaller.

FIG. 3B illustrates the impact of variation in the first self-aligned spacer step 152 on the trench CD. As can be seen in FIG. 3B, when the CD in the first self-aligned spacer step 152 is larger, i.e., when the width of spacers 1 in FIG. 1C is larger, the width of trench A remains constant, the width of trench B increases and the width of trench C decreases twice as fast.

FIG. 3C illustrates the impact of variation in the second self-aligned spacer step 154 on the trench CD. As can be seen in FIG. 3C, when the CD in the second self-aligned spacer step 154 is larger, i.e., when the width of spacers 2 in FIG. 1F is larger, the width of trench B remains constant and the width of both trenches A and C decreases twice as fast.

Figure 4:
FIG. 4 illustrates a top view of a conventional two-dimensional (2D) line-space device resulting from an SAQP process.

To monitor a multiple patterning process, a 3D target design may be used in place of the conventional 2D line-space targets. FIG. 4, by way of example, illustrates a top view of a conventional 2D line-space target 300, including lines 302 and trenches 304, resulting from a SAQP process. Target 300 is referred to as two-dimensional, as the lines extend well beyond the field of measurement of a metrology device measuring the target 300, and thus, only the width and height dimensions of the lines and trenches are viewed. While the trenches 304 are illustrated in FIG. 4 with different hash marks to clearly identify the different trenches, in the traditional 2D line-space target 300 all of the resulting trenches are nearly identical, making it difficult to determine the registration of the trenches, which is necessary to monitor the process of each patterning step. Moreover, typically within the chip, there are a large number of line/space patterns that are side by side. Accordingly, within the field of measurement of the metrology device the targets appear as a grating with, e.g., 400 sets within a 40 μm spot. Accordingly, one assignment 310 of the trench registration, illustrated with the solid frame, will appear to be as valid as an alternative assignment 320, illustrated with a dashed frame. Any attempt to drastically change the width of an individual trench to help distinguish the registration, however, will result in the target being not compatible with the process.

Figure 5:
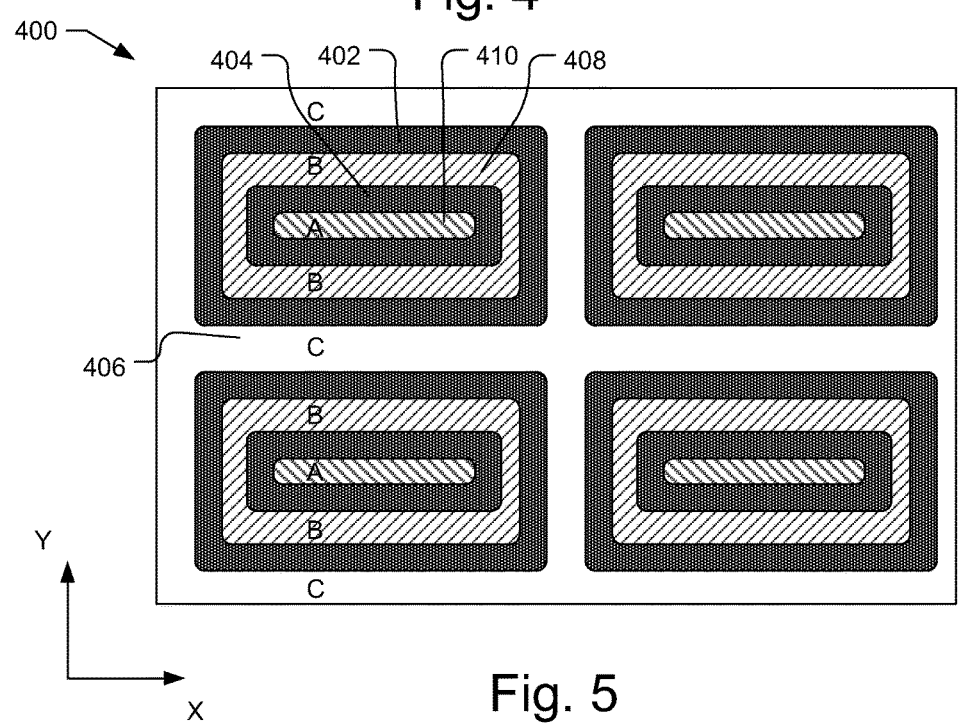
FIG. 5 illustrates a top view of a sub-pattern that may be used in a three-dimensional (3D) metrology target for monitoring the SAQP process.

FIG. 5 illustrates a top view of a portion of the metrology target 400 (sometimes referred to as a sub-pattern) for monitoring the SAQP process. As can be seen, the portion of the metrology target 400 has a 3D design with two sets of lines 402 and 404, and intervening spaces 406, 408, and 410. The lines 402 and 404 extend in both the X direction and the Y direction to form boxes. The length of the lines 402, i.e., in the X direction is less than the field of measurement of the metrology device measuring the target 400, and thus, the length, width and height dimensions of the lines and trenches are viewed. With 3D design of the target 400, e.g., with the lines 402 and 404 forming boxes, the registration of the spaces is easily assigned, as indicated in FIG. 5. Moreover, the pattern also has the benefit of better compatibility to the multiple patterning process as it requires no cut mask, i.e., no extra step.

Thus, the orthogonally arranged lines and trenches in the target 400 produces two sets of a first box within a second box, with a first trench A (410) disposed within the first box formed with lines 404, second trenches B (408) disposed between the first box formed with lines 404 and the second box formed with lines 402, and a third trench C (406) between the two sets.

Figure 6:
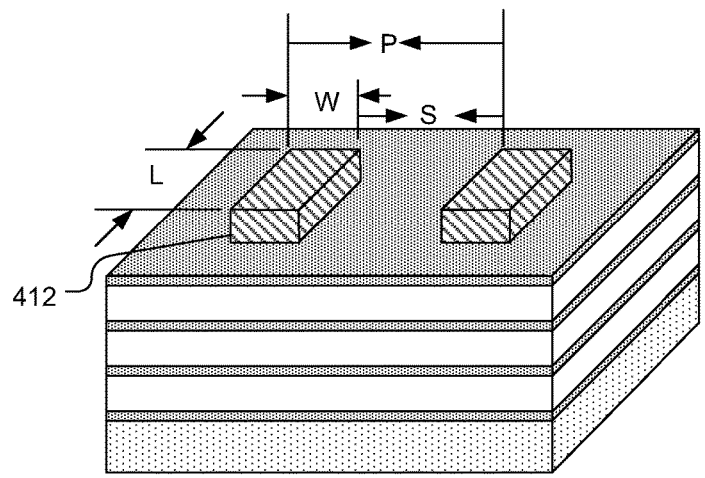
FIG. 6 illustrates the lithography patterning step used in the SAQP process to produce the sub-pattern of FIG. 5.

FIG. 6 illustrates the lithography patterning step used in the SAQP process to produce the target 400. As illustrated in FIG. 6, during the lithography process, target 400 is produced with resist 412 having a length L, which is significantly short than the length of the lines used in the actual device. The remaining parameters, e.g., width W, space S, and pitch P may be the same as used in the actual device. If desired, however, one or more variations may be included in the remaining parameters.

Figure 7:
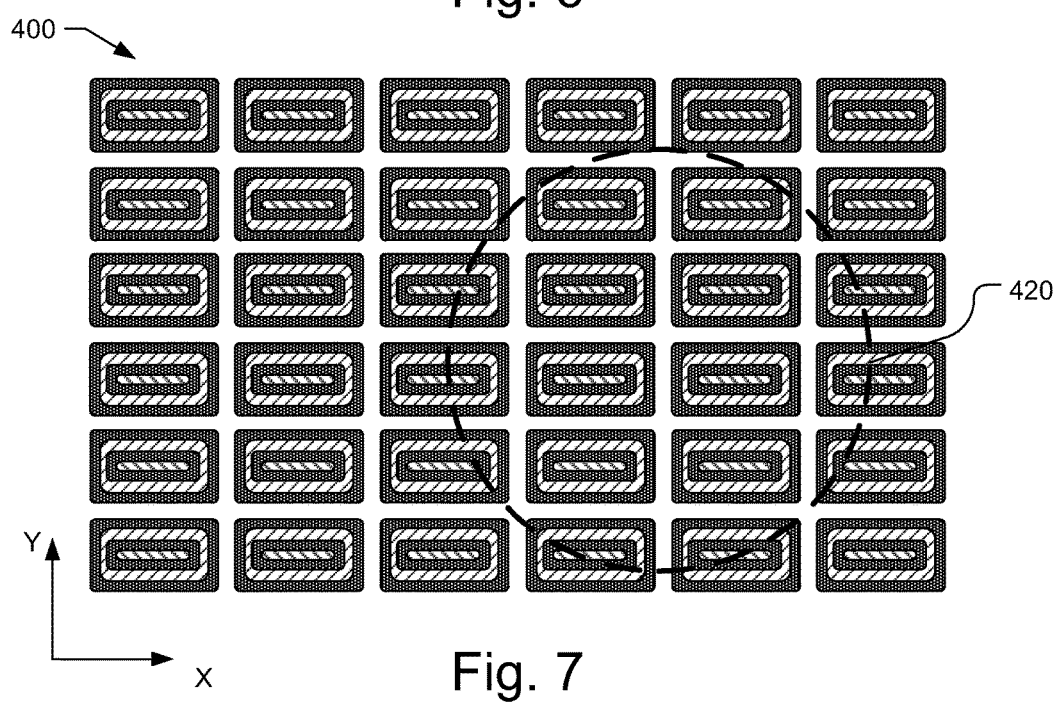
FIG. 7 is a top view of a 3D metrology target including a repeating pattern of sub-patterns, which may be used for monitoring the SAQP process.

FIG. 7 is a top view of the metrology target 400, which as can be seen has a repeating pattern of sub-patterns, which may be used for monitoring the SAQP process. Thus, the metrology target has a first pitch in a first direction (X axis) and the plurality of sub-patterns has a second pitch in a second direction (Y axis) that is different than the first direction. Additionally, in FIG. 7, the field of measurement 420 of the metrology device is illustrated with a dashed line. As can be seen in FIG. 7, the target 400 has a pitch in the second direction that is configured so that the sub-patterns repeat several times within the field of measurement 420, so that both ends along the length of sub-patterns can be seen within the field of measurement 420. In one example, the target 400 may have sub-patterns that repeat five times or more within the field of measurement 420. The target 400 may also have a pitch in the first direction that is also configured so that the sub-patterns repeat several times within the field of measurement 420, so that both ends along the width of sub-patterns can be seen within the field of measurement 420.

Figure 8:
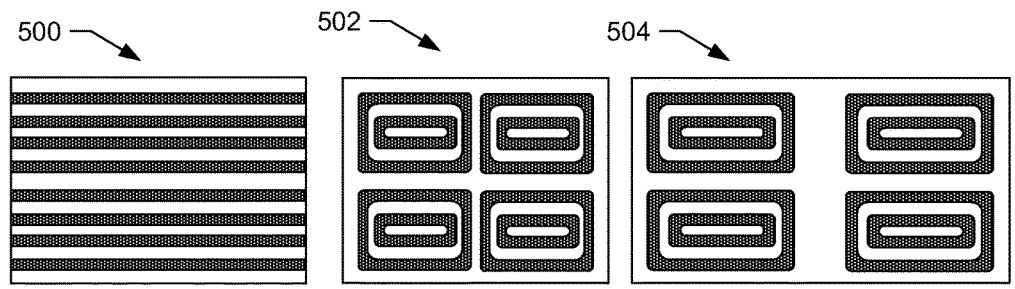
FIG. 8 illustrates top views of a standard 2D design target, and two comparable 3D design targets with different pitches along the length.

FIG. 8 illustrates top views of a standard 2D design target 500, with e.g., 96 nm pitch, and a comparable 3D design target 502 with a 96 nm×192 nm pitch, and another comparable 3D design target 504 with a 96 nm×384 nm pitch.

Figure 9:
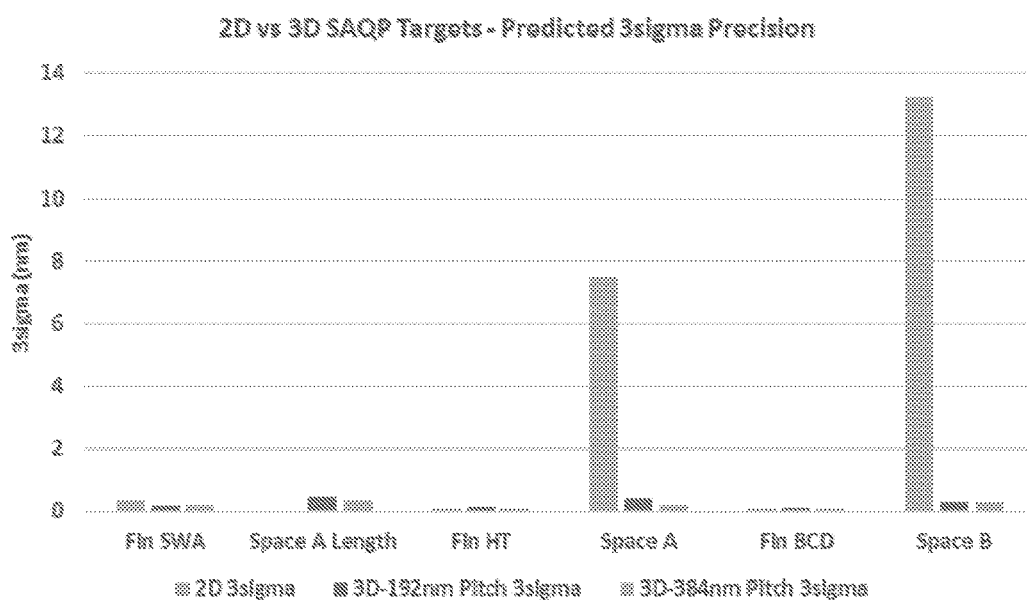
FIG. 9 is a graph illustrating a comparison of the simulated precision of the standard targets illustrated in FIG. 8.

FIG. 9 is a graph illustrating a comparison of the simulated 3sigma precision (i.e., the 3 times the standard deviation of a set of data) of the standard 2D design target 500 and the 3D design targets 504 and 506, where "Fin" indicates the channel formation of a FinFET device, "SWA" is sidewall angle, "HT" is height, "Space A" is the width of Space A, e.g., as identified in FIGS. 4 and 5, "BCD" is the bottom critical dimension, and "Space B" is the width of Space B, e.g., as identified in FIGS. 4 and 5. As can be seen, in addition to the capability of assigning trench registration, the 3D design targets 502 and 504 also improve the precision for OCD measurement, by more than an order of magnitude for the widths of space A and space B.

With the use of the 3D design target, metrology is simplified as the line and spaces created by multiple process steps are different from each other in shape and dimension, and therefore the registration can be easily assigned. With the proper assignment of the trench registration, the scatterometry data obtained from the 3D design target may be processed and analyzed in a conventional manner. The scatterometry data may be analyzed, e.g., using modeling, such as Rigorous Coupled Wave Analysis (RCWA) based scatterometry, to determine any variations present in the multiple patterning process.

Figure 10:
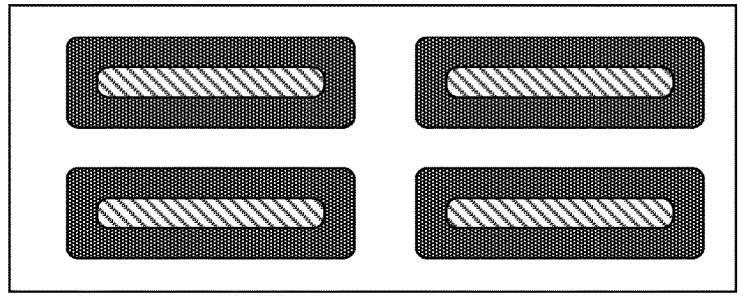
FIG. 10 illustrates a top view of a sub-pattern that may be used in a three-dimensional (3D) metrology target for monitoring the self-aligned doubled patterning (SADP) process.

While the SAQP process is specifically addressed by the target design shown in FIGS. 5-9, it should be understood that other multiple patterning processes may be monitored using similarly 3D designed targets. For example, FIG. 10 illustrates a top view of a portion of the metrology target 450 (sometimes referred to as a sub-pattern) for monitoring the SADP process. As illustrated, the sub-pattern 450 includes orthogonally arranged lines that produce two sets of boxes, with a trench disposed within the boxes and a trench between the two sets of boxes. As discussed with sub-pattern 400, the pitch of the plurality of sub-patterns 450 is configured so that there is a plurality of sub-patterns within a field of measurement of a metrology device.

Figure 11:
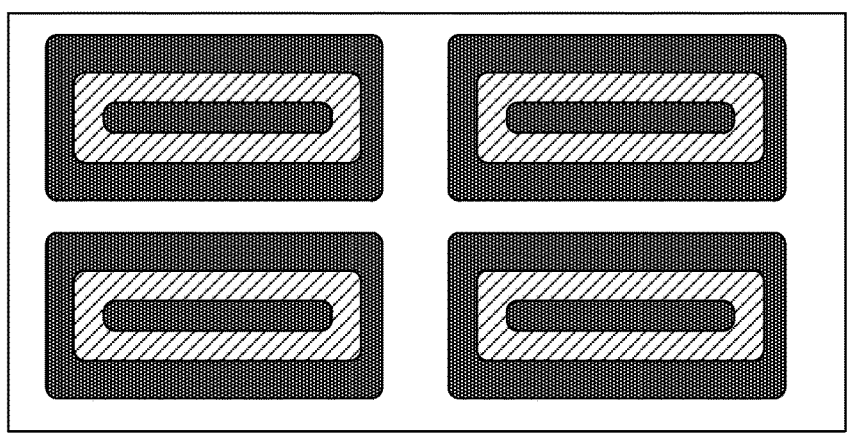
FIG. 11 illustrates a top view of a sub-pattern that may be used in a three-dimensional (3D) metrology target for monitoring the self-aligned triple patterning (SATP) process.

FIG. 11 illustrates a top view of a portion of the metrology target 460 (sometimes referred to as a sub-pattern) for monitoring the self-aligned triple patterning (SATP) process. As illustrated, the sub-pattern 460 includes orthogonally arranged lines that produce two sets of boxes, with a line disposed in a box and a trench disposed between the line and the box, and a trench between the two sets of boxes. As discussed with sub-pattern 400, the pitch of the plurality of sub-patterns 460 is configured so that there is a plurality of sub-patterns within a field of measurement of a metrology device.

Figure 12:
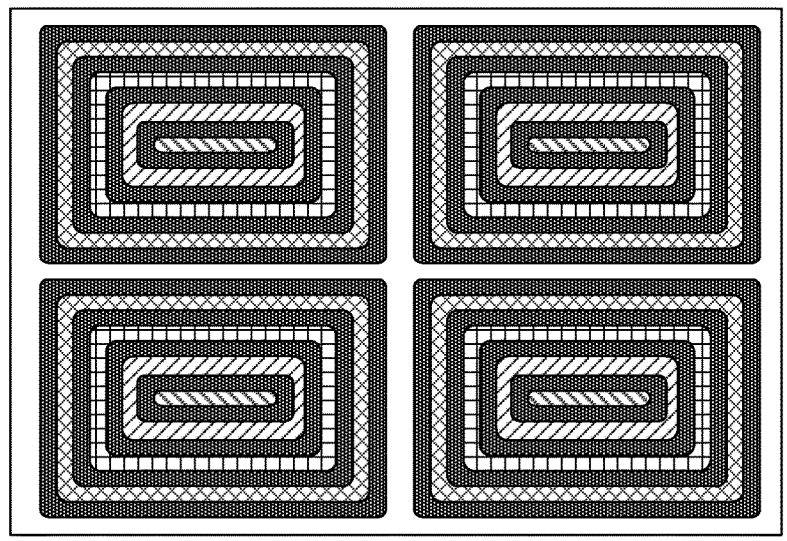
FIG. 12 illustrates a top view of a sub-pattern that may be used in a three-dimensional (3D) metrology target for monitoring the self-aligned octuple patterning (SAOP) process.

FIG. 12 illustrates a top view of a portion of the metrology target 470 (sometimes referred to as a sub-pattern) for monitoring the self-aligned octuple patterning (SAOP) process. As illustrated, the sub-pattern 470 includes orthogonally arranged lines that produce two sets of nested boxes, each set includes four nested boxes with trenches disposed between each box and between the sets. As discussed with sub-pattern 400, the pitch of the plurality of sub-patterns 470 is configured so that there is a plurality of sub-patterns within a field of measurement of a metrology device.

Figure 13:
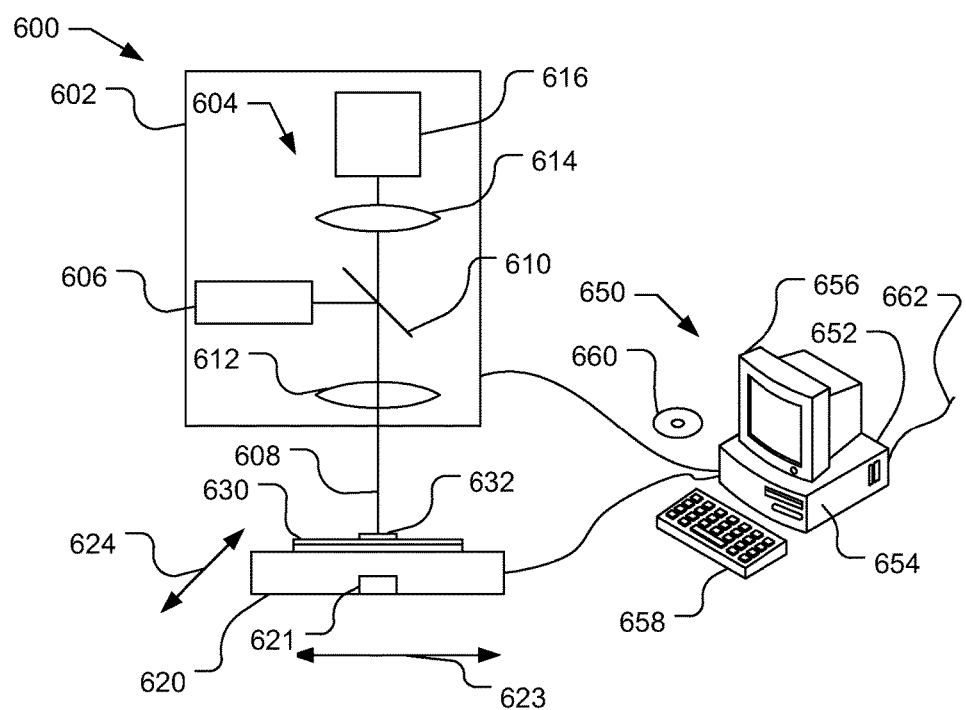
FIG. 13 illustrates a schematic view of an optical metrology device that may be used to collect and analyze scatterometry data from metrology targets to monitor a multiple patterning process.

FIG. 13, by way of example, illustrates a schematic view of an optical metrology device 600 that may be used to collect and analyze scatterometry data from a 3D design metrology target 632 for monitoring a multiple patterning process as discussed above. The metrology device 600 includes an optical head 602 coupled to a computer 650, such as a workstation, a personal computer, central processing unit or other adequate computer system, or multiple systems, that analyzes the data collected from the target 632. The optical metrology device 600 illustrated in FIG. 13 is, e.g., a spectroscopic reflectometer, but if desired, any optical metrology device capable of collecting scatterometry data may be used, such as an ellipsometer. If desired, multiple optical heads, i.e., different metrology devices, may be combined in the same metrology device 600. The computer 650 may also control the movement of a stage 620 that holds the wafer 630 that includes the target 632 via actuators 621 and/or the optical head 602. The stage 620 may be capable of horizontal motion in either Cartesian (i.e., X and Y) coordinates, as indicated by arrows 623 and 624, or Polar (i.e., R and θ) coordinates or some combination of the two. The stage 620 and/or optical head 602 may also be capable of vertical motion, e.g., for focusing.

The optical head 602 may include an optical system 604 including a broadband light source 606, such as a Xenon Arc lamp and/or a Deuterium lamp, and a detector 616, such as a spectrometer. In operation, light produced by the light source 606 may be directed along an optical axis 608, e.g., via beam splitter 610, toward the wafer 630 which includes a target 632. An objective 612 focuses the light onto the target 632 and receives light that is reflected from the target 632. The reflective light may pass through the beam splitter 610 and is focused with lens 614 onto the detector 616. The detector 616 provides a spectroscopic signal to the computer 650. The objective 612, beam splitter 610, lens 614, and detector 616 are merely illustrative of typical optical elements that may be used. Additional optical elements, such as a polarizer and/or analyzer, may be used if desired. Moreover, generally, additional optical elements such as field stops, lenses, etc. may be present in the optical system 604.

The optical system 604 produces a measurement spot on the target 632, and the detector 616 receives the resulting spectral signal. The spectral signal from the target 632 may be provided to a computer 650, which additionally has the target models. The computer 650 includes a processor 652 with memory 654, as well as a user interface including e.g., a display 656 and input devices 658. The scatterometry data, along with the target models, may be stored at least temporarily in memory 654 or in non-transitory computer-usable storage medium 660. Additionally, non-transitory computer-usable storage medium 660 may have computer-readable program code embodied thereon and may be used by the computer 650 for causing the processor to control the metrology device and to perform the functions described herein for analyzing the scatterometry data. The data structures and software code for automatically implementing one or more acts described in this detailed description can be implemented by one of ordinary skill in the art in light of the present disclosure and stored, e.g., on a computer usable storage medium 660, which is any non-transitory device or medium that can store code and/or data for use by a computer system such as processor 652. The computer-usable storage medium 660 may be, but is not limited to, magnetic and optical storage devices such as disk drives, magnetic tape, compact discs, and DVDs (digital versatile discs or digital video discs). A communication port 662 may also be used to receive instructions that are stored in memory 654 or other storage in computer 650 and used to program the computer 650 to perform any one or more of the functions described herein and may represent any type of communication connection, such as to the internet or any other computer network. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described. The results from the analysis of the scatterometry data may be stored, e.g., in memory 654 associated with the wafer 630 and/or provided to a user, e.g., via display 656, an alarm or other output device. Moreover, the results from the analysis may be fed back to the process equipment to adjust the appropriate patterning step to compensate for any detected variances in the multiple patterning process.

Figure 14:
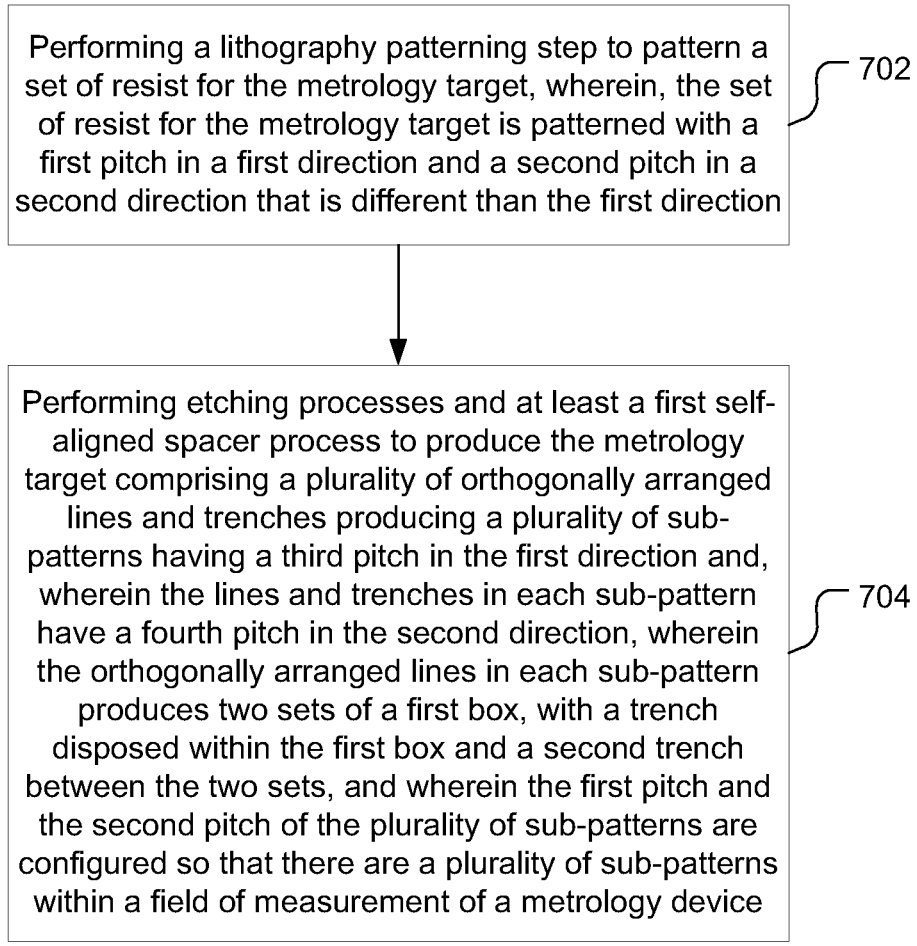
FIG. 14 is a flow chart illustrated a method of manufacturing a metrology target on a wafer for monitoring a multiple patterning process.

FIG. 14 is a flow chart illustrated a method of manufacturing a metrology target on a wafer for monitoring a multiple patterning process. As illustrated, a lithography patterning step is performed to pattern a set of resist for the metrology target (702). The set of resist for the metrology target is patterned with a first pitch in a first direction and a second pitch in a second direction that is different than the first direction. An etching processes is performed and at least a first self-aligned spacer process is performed to produce the metrology target comprising a plurality of orthogonally arranged lines and trenches producing a plurality of sub-patterns having a third pitch in the first direction and, wherein the lines and trenches in each sub-pattern have a fourth pitch in the second direction (704). The orthogonally arranged lines in each sub-pattern produces two sets of a first box, with a trench disposed within the first box and a second trench between the two sets, and wherein the first pitch and the second pitch of the plurality of sub-patterns are configured so that there are a plurality of sub-patterns within a field of measurement of a metrology device.

Figure 15:
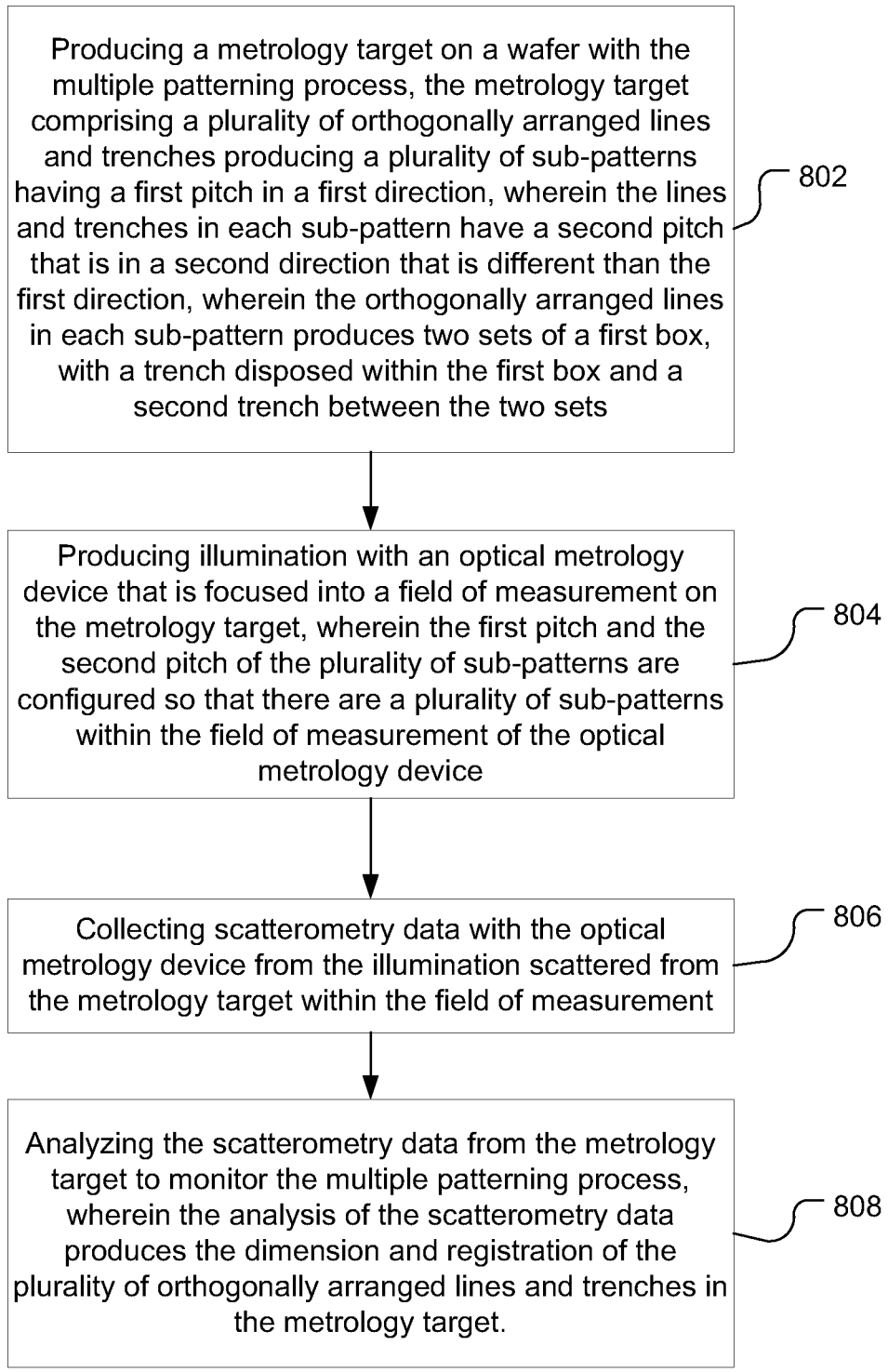
FIG. 15 is a flow chart illustrated a method of monitoring a multiple patterning process.

FIG. 15 is a flow chart illustrated a method of monitoring a multiple patterning process. As illustrated, the method includes producing a metrology target on a wafer with the multiple patterning process (802). The metrology target includes a plurality of orthogonally arranged lines and trenches producing a plurality of sub-patterns having a first pitch in a first direction, wherein the lines and trenches in each sub-pattern have a second pitch that is in a second direction that is different than the first direction, wherein the orthogonally arranged lines in each sub-pattern produces two sets of a first box, with a trench disposed within the first box and a second trench between the two sets. Illumination is produced with an optical metrology device that is focused into a field of measurement on the metrology target (804), wherein the first pitch and the second pitch of the plurality of sub-patterns are configured so that there are a plurality of sub-patterns within the field of measurement of the optical metrology device. Scatterometry data is collected with the optical metrology device from the illumination scattered from the metrology target within the field of measurement (806). The scatterometry data from the metrology target is analyzed to monitor the multiple patterning process, wherein the analysis of the scatterometry data produces the dimension and registration of the plurality of orthogonally arranged lines and trenches in the metrology target (808). Analyzing the scatterometry data may be performed using a model of the metrology target that is registered with the plurality of orthogonally arranged lines and trenches in the metrology target.

The multiple patterning process described above may be, for example, a self-aligned doubled patterning (SADP) process. The multiple patterning process may be a self-aligned quadruple patterning (SAQP) process, wherein the method further includes performing a second self-aligned spacer process to produce the metrology target, wherein the orthogonally arranged lines in each sub-pattern further produces the two sets including a second box, wherein the first box is within the second box, and a third trenches disposed between the first box and the second box. The multiple patterning process may be a self-aligned triple patterning (SATP) process, and wherein the 3D arranged lines in each sub-pattern further produces a line within the first box, wherein the trench disposed within the first box is between the line and the first box. The multiple patterning process may be a self-aligned octuple patterning (SAOP) process, and wherein the 3D arranged lines in each sub-pattern further produces the two sets including a second box, a third box, and a fourth box, wherein the first, second third, and fourth boxes are nested and trenches are disposed between the first, second, third, and fourth boxes. The first pitch and the second pitch of the plurality of sub-patterns may be configured so that there are at least five sub-patterns within the field of measurement of the metrology device.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of monitoring a multiple patterning process, the method comprising:
    producing a metrology target on a wafer with the multiple patterning process, the multiple patterning process comprising a lithography step and at least one self-aligned spacer step that produce a plurality of orthogonally arranged lines and trenches of the metrology target, wherein the plurality of orthogonally arranged lines and trenches produce a plurality of sub-patterns having a first pitch in a first direction, wherein the plurality of orthogonally lines and trenches in each sub-pattern have a second pitch that is in a second direction that is different than the first direction, wherein the plurality of orthogonally arranged lines in each sub-pattern produces two sets of a first box, with a first trench disposed within the first box and a second trench between the two sets, wherein the lines and trenches of the metrology target monitor variation in critical dimension of the lithography step and the at least one self-aligned spacer step used in the multiple patterning process;
    producing illumination with an optical metrology device that is focused into a field of measurement on the metrology target, wherein the first pitch and the second pitch of the plurality of sub-patterns are configured so that there are a plurality of sub-patterns within the field of measurement of the optical metrology device;
    collecting scatterometry data with the optical metrology device from the illumination scattered from the metrology target within the field of measurement; and
    analyzing the scatterometry data from the metrology target to monitor the multiple patterning process, wherein the analysis of the scatterometry data produces the dimension and registration of the plurality of orthogonally arranged lines and trenches in the metrology target which is correlated to the variation in critical dimension of the lithography step and the at least one self-aligned spacer step used in the multiple patterning process.

2. The method of claim 1, wherein analyzing the scatterometry data comprises using a model of the metrology target that is registered with the plurality of orthogonally arranged lines and trenches in the metrology target.

3. The method of claim 1, wherein the multiple patterning process is a self-aligned doubled patterning (SADP) process.

4. The method of claim 1, wherein the multiple patterning process is a self-aligned quadruple patterning (SAQP) process, and wherein the plurality of orthogonally arranged lines in each sub-pattern further produces the two sets including a second box, wherein the first box is within the second box, and a third trench disposed between the first box and the second box.

5. The method of claim 1, wherein the multiple patterning process is a self-aligned triple patterning (SATP) process, and wherein the plurality of orthogonally arranged lines in each sub-pattern further produces a line within the first box, wherein the first trench disposed within the first box is between the line and the first box.

6. The method of claim 1, wherein the multiple patterning process is a self-aligned octuple patterning (SAOP) process, and wherein the plurality of orthogonally arranged lines in each sub-pattern further produces the two sets including a second box, a third box, and a fourth box, wherein the first, second third, and fourth boxes are nested and trenches are disposed between the first, second, third, and fourth boxes.

7. The method of claim 1, wherein the first pitch and the second pitch of the plurality of sub-patterns are configured so that there are at least five sub-patterns within the field of measurement of the optical metrology device.

* * * * *